(12) United States Patent
McAdams

(10) Patent No.: US 9,350,336 B2
(45) Date of Patent: May 24, 2016

(54) TIMING COMPENSATION USING THE SYSTEM CLOCK

(71) Applicant: Texas Instruments Incorporated, Dallas, TX (US)

(72) Inventor: Hugh P. McAdams, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 12 days.

(21) Appl. No.: 14/577,640

(22) Filed: Dec. 19, 2014

(65) Prior Publication Data

US 2015/0222282 A1  Aug. 6, 2015

Related U.S. Application Data

(60) Provisional application No. 61/936,091, filed on Feb. 5, 2014.

(51) Int. Cl.
*H03L 7/00* (2006.01)
*H03K 5/00* (2006.01)

(52) U.S. Cl.
CPC .................................. *H03K 5/00006* (2013.01)

(58) Field of Classification Search
USPC .......................................... 327/144, 145, 147
See application file for complete search history.

(56) References Cited

U.S. PATENT DOCUMENTS

| | | | | |
|---|---|---|---|---|
| 3,860,760 A | * | 1/1975 | Rittenbach | H04B 1/662 327/100 |
| 4,713,788 A | * | 12/1987 | Kasahara | G06F 1/0335 708/271 |
| 6,104,442 A | * | 8/2000 | Patel | H03D 1/24 348/725 |
| 6,697,416 B1 | * | 2/2004 | Jennings | G06F 1/04 327/291 |
| 8,284,888 B2 | * | 10/2012 | Kyles | H03L 7/07 327/141 |
| 8,536,915 B1 | * | 9/2013 | Terrovitis | H03L 7/16 327/147 |
| 8,804,892 B2 | * | 8/2014 | Kyles | H03D 3/24 327/141 |
| 2001/0026179 A1 | * | 10/2001 | Saeki | H03K 5/131 327/147 |
| 2001/0043652 A1 | * | 11/2001 | Hooley | H03K 7/08 375/238 |
| 2006/0001464 A1 | * | 1/2006 | Yokozeki | H03L 7/07 327/156 |
| 2008/0055697 A1 | * | 3/2008 | Okazaki | H04N 1/047 359/238 |
| 2010/0001769 A1 | * | 1/2010 | Brantley | G04F 10/04 327/144 |
| 2013/0200931 A1 | * | 8/2013 | Kono | G01R 31/31726 327/150 |
| 2015/0222282 A1 | * | 8/2015 | McAdams | H03K 5/00006 327/145 |
| 2015/0340072 A1 | * | 11/2015 | Mazumder | G11C 7/222 365/189.05 |

* cited by examiner

*Primary Examiner* — Adam Houston
(74) *Attorney, Agent, or Firm* — Rose Alyssa Keagy; Frank D. Cimino

(57) ABSTRACT

An integrated circuit including a plurality of internal clock generator circuits from which an internal clock is selected based on an external time reference. A number of cycles of internal clock signals from each of the internal clock generator circuits, or from at least one of those circuits where a frequency relationship is known, is counted relative to a system clock signal based on the external time reference. The lowest frequency internal clock signal providing at least a minimum number of cycles within the system clock period, the minimum number assuring completion of a function within a time constraint, is selected as the internal clock. Robust performance over a wide range of fabrication process parameters and operating conditions is assured.

19 Claims, 5 Drawing Sheets

TIMING COMPENSATION USING THE SYSTEM CLOCK

CROSS-REFERENCE TO RELATED APPLICATIONS

This application claims priority, under 35 U.S.C. §119(e), of Provisional Application No. 61/936,091, filed Feb. 5, 2014, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit architecture. Embodiments of this invention are more specifically directed to generation of internal clock signals in large scale integrated circuits.

Advances in semiconductor technology in recent years have reduced the minimum feature sizes of semiconductor devices in integrated circuits. These advances have correspondingly increased the functionality of very large-scale integrated circuits for a given chip area, such that a single modern integrated circuit can now contain over one billion transistors, and can carry out multiple complex functions into integrated circuit. In addition, these reductions in device feature sizes, such as metal-oxide-semiconductor (MOS) transistor gates, also serve to increase the switching speed of those devices and the overall performance of the integrated circuit.

Internal operations in these large scale integrated circuits, particularly those involving digital logic, are typically clocked. Some integrated circuits receive an external timing reference, such as a crystal oscillator or an externally generated clock signal, from which clock signals can be derived, particularly for those operations such as input and output that synchronous with external functions. Internal functions within the integrated circuit, such as those functions that are carried out within an external clock, are typically based on internally-generated clock signals. Examples of conventional internal clock generator circuits include oscillators, frequency synthesizers, and the like, along with associated frequency divider or clock multiplier functions. Examples of internal functions controlled by such internal clock signals include the timing of signals involved in accessing selected memory cells in a memory array in the integrated circuit. Different memory technologies (e.g., static random access memory (RAM), non-volatile RAM or read-only memory (ROM), dynamic RAM, etc.) may be implemented in the same large scale integrated circuit, and may require control signals with different timing.

As fundamental in the art, the electrical behavior of solid-state components, such as MOS transistors, varies depending on certain parameters. Variations in the fabrication process, for example variations in MOS transistor gate width or threshold voltage, will be reflected in the electrical performance of transistors and other components. The operating conditions of the integrated circuit, including the power supply voltage and the operating temperature, also result in variations in electrical performance. For example, the switching speed of transistors in the integrated circuit will vary with power supply voltage, operating temperature, and variations in fabrication process parameters.

For those integrated circuits in which internal functions are clocked by internal clocks, these variations in device performance affect both internal clock generator circuits and the circuits controlled by those clock generator circuits. It has been observed that internal timing may vary, due to these causes, by as much as 100% between the fastest "corner" of the process, voltage, and temperature (i.e., the combination of process parameters, power supply voltage, and operating temperature meeting specification limits that results in the fastest transistor switching speed) and the slowest "corner". While this variation in internal timing must be dealt with in the design of the integrated circuit, the matching of device sizes and attributes in modern complementary MOS (CMOS) integrated circuits generally allow the various circuit functions within the same device to "track" one another over these variations in process, voltage, and temperature. In other words, the various delay and switching times within the same integrated circuit tend to track one another over variations in process, temperature, and voltage. This tracking among devices in the same integrated circuit provides robustness in the overall integrated circuit operation over these variations.

A recently developed technology for realizing non-volatile solid-state memories in integrated circuits involves the construction of capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. It has been observed that ferroelectric capacitors can be constructed by processes that are largely compatible with modern CMOS integrated circuits, for example by placing capacitors above the transistor level, between overlying levels of metal conductors. As a result, ferroelectric technology is now utilized in non-volatile solid-state read/write random access memory (RAM) devices. These memory devices, commonly referred to as "ferroelectric RAM", or "FeRAM", or "FRAM" devices, are now commonplace in many electronic systems, particularly portable electronic devices and systems, and are especially attractive for implantable medical devices such as pacemakers and defibrillators. Various memory cell architectures including ferroelectric capacitors are known in the art, including the 1T-1C (one transistor, one capacitor) arrangement, similar to conventional dynamic RAM memory cells, the 2T-2C (two transistor, two capacitor) cells in which the two ferroelectric capacitors in a cell are polarized to complementary states, and also in a "6T" CMOS static RAM cells in which ferroelectric capacitors coupled to each storage node can be programmed with the stored data state. As known in the art, the state of a ferroelectric memory cell is read by interrogating the capacitance of the ferroelectric capacitors to discern its polarization state, specifically by detecting the polarization capacitance (i.e., charge storage) that occurs upon application of a voltage above the coercive voltage. When the memory state is opposite that of the applied voltage, that voltage will cause the capacitor to change its polarization state, which appears as a relatively high capacitance. But when the memory state matches that of the applied voltage, that voltage exhibits little capacitance due to polarization, since its ferroelectric domains are already aligned in the direction of the applied coercive voltage, causing little additional polarization charge to be stored.

Unfortunately, it has been observed that the switching behavior of ferroelectric capacitor does not necessarily track that of conventional CMOS devices over variations in process, voltage, and temperature. In particular, it has been observed that the polarization charge of the ferroelectric capacitor at cold temperature (−40° C.) is reduced because the coercive voltage of the material increases with decreasing temperature, which weakens the stored state. In addition, the time required to "extract" the polarization charge (i.e., read the memory state of the ferroelectric capacitor) increases with decreasing temperature. As such, cold temperature operation of ferroelectric memory results in a read signal that is both weaker and slower, as additional time is necessary to develop a data signal for detection by the sense amplifiers in the memory. In contrast, cold temperature decreases switching times and propagation delays in CMOS circuits, including internal clock generators, sense amplifiers, and other circuits involved in the access of FRAM memory cells. This mismatch between the faster operation of CMOS circuits and the slower response by the ferroelectric cells requires additional delay to be designed into the sense operation to ensure functionality at cold temperature. But this additional delay will further slow the memory operation at the high temperature operating corner at which the CMOS circuits are already at their slowest, which pushes out the access and cycle times of the memory.

BRIEF SUMMARY OF THE INVENTION

Disclosed embodiments provide an integrated circuit and method of operating the same that provide compensation in internal clock generation for variations in process, voltage, and temperature.

Disclosed embodiments provide such a circuit and method that optimizes the operation of circuit functions involving technologies with non-tracking behavior over such variations, such as ferroelectric memory devices and CMOS logic and clock circuits.

Disclosed embodiments provide such a circuit and method in which such compensation is efficiently provided, from the standpoint of chip area.

Disclosed embodiments provide such a circuit and method in which such compensation is provided without reducing memory availability.

Other objects and advantages of the disclosed embodiments will be apparent to those of ordinary skill in the art having reference to the following specification together with its drawings.

According to certain embodiments, a plurality of internal clock circuits operating at different frequencies are provided in the integrated circuit. Following power-up of the integrated circuit, the number of cycles of each of the plurality of internal clock circuits occurring within a selected number of cycles (one or more) of a system clock are measured, under the then-current voltage and temperature operating conditions. The lowest-frequency one of the internal clock circuits that provides a selected number of clock cycles over the measurement time is then selected for operation of the integrated circuit.

According to another embodiment, a plurality of internal clock circuits operating at different frequencies in known relationship to one another are provided in the integrated circuit. Following power-up of the integrated circuit, the number of cycles of one of the internal clock circuits occurring within a selected number of cycles (one or more) of a system clock is measured, under the then-current voltage and temperature operating conditions. Based on the relationship of the frequencies of the plurality of internal clock circuits relative to the measured clock circuit, the lowest-frequency one of the internal clock circuits that will provide a selected number of clock cycles over the measurement time is then selected for operation of the integrated circuit.

DETAILED DESCRIPTION OF THE INVENTION

The one or more embodiments described in this specification are implemented into an integrated circuit that includes a ferroelectric memory, as it is contemplated that such implementation is particularly advantageous in that context. However, it is also contemplated that concepts of this invention may be beneficially applied to integrated circuits for other applications, including other types of integrated circuits that do not necessarily include a ferroelectric memory or any memory. Rather, it is contemplated that concepts of this invention may be beneficially applied to any integrated circuits in which compensation is desired for variations in process parameters, power supply voltage, operating temperature, and other parameters that affect device performance. Accordingly, it is to be understood that the following description is provided by way of example only, and is not intended to limit the true scope of this invention as claimed.

Figure 1A:
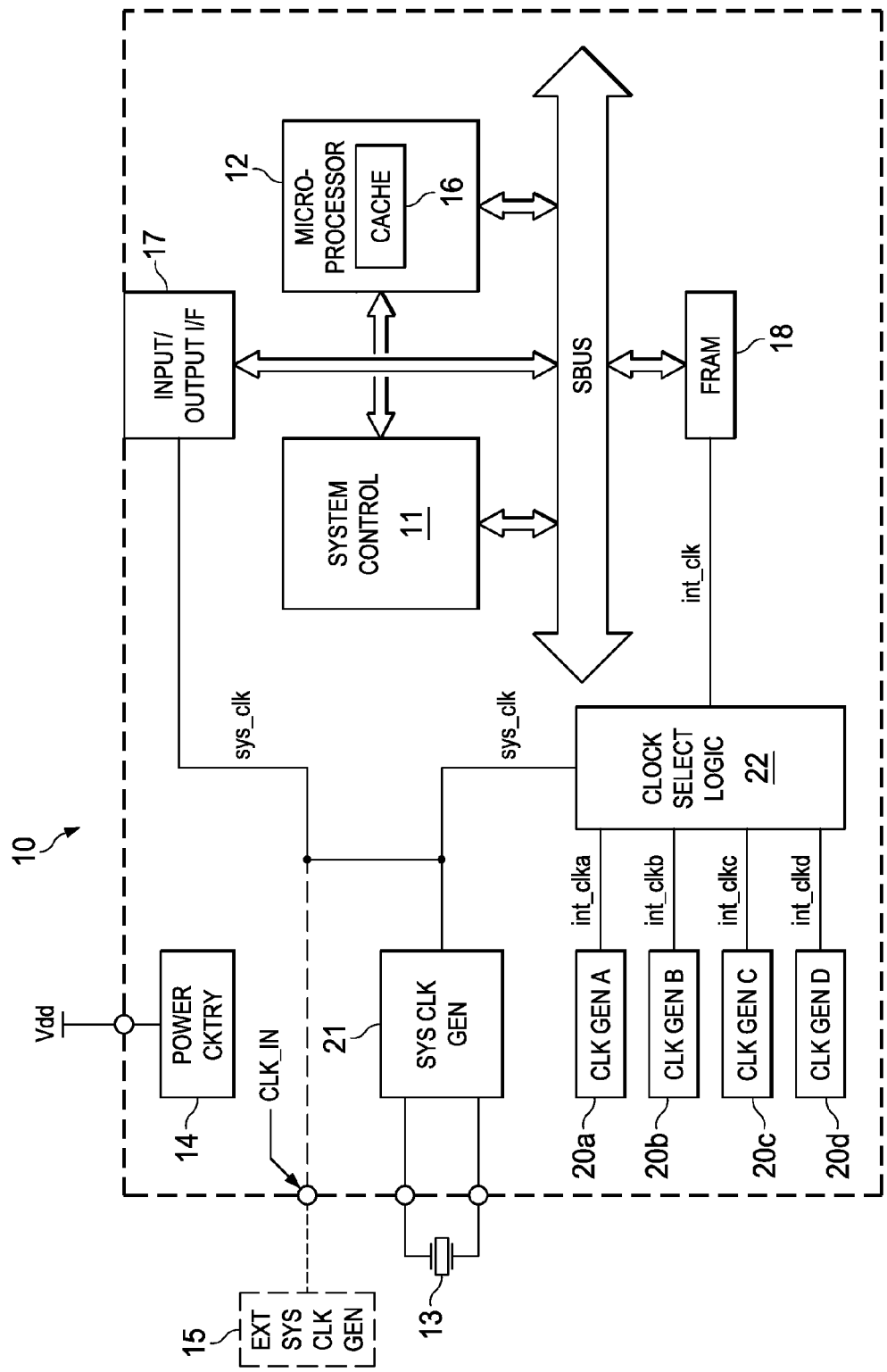
FIGS. 1a and 1b are electrical diagrams, in block form, of an integrated circuit constructed according to an embodiment.

FIG. 1a illustrates an example of large-scale integrated circuit 10 according to an embodiment. Integrated circuit 10 in this example is in the form of a so-called "system-on-a-chip" ("SoC"), namely a single-chip integrated circuit into which an entire computer architecture is realized. As such, in this example, integrated circuit 10 includes a central processing unit of microprocessor 12 connected to system bus SBUS. Various memory resources, including ferroelectric random access memory (FRAM) 18. FRAM 18 may serve as data memory, and also as program memory so as to store program instructions executable by microprocessor 12. Of course, other memory resources may additionally or alternatively be implemented in integrated circuit 10. Cache memory 16 (such as level 1, level 2, and level 3 caches, each typically implemented as static RAM) provides such another memory resource, and resides within microprocessor 12 itself and therefore does not require bus access. Of course, integrated circuit 10 need not necessarily include ferroelectric or other non-volatile memory as FRAM 18, but rather may have its data memory in the form of conventional SRAM or other RAM, and may have read-only memory (ROM) or electrically erasable programmable read-only memory (EEPROM) residing on system bus SBUS to serve as program memory. Other system functions are shown, in a generic sense, in integrated circuit 10 by way of system control 11 and input/output interface 17.

Those skilled in the art having reference to this specification will recognize that integrated circuit 10 may include additional or alternative functions to those shown in FIG. 1a, or may have its functions arranged according to a different architecture from that shown in FIG. 1a. For example, integrated circuit 10 may be a stand-alone ferroelectric memory device based on FRAM 18, in which case microprocessor unit 12 and other functions shown in FIG. 1a will not be included. Accordingly, the architecture and functionality of integrated circuit 10 of FIG. 1a is provided by way of example, and is not intended to limit the scope of this invention.

According to embodiments, various clock circuitry is provided to control the operation of the various component functions of integrated circuit 10. In this embodiment shown in FIG. 1a, multiple clock generator circuits 20a through 20d are provided in the architecture of integrated circuit 10. Clock generator circuits 20a, 20b, 20c, 20d may be constructed in the conventional manner, for example as oscillators (e.g., ring oscillators, RC oscillators, Schmitt trigger oscillators, and the like). In any case, clock generator circuits 20a, 20b, 20c, 20d generate separate internal clock signals int_clka, int_clkb, int_clkc, int_clkd, respectively, all of which are applied to clock select logic 22. According to these embodiments, these internal clock signals int_, int_clkb, int_clkc, int_clkd are at different frequencies from one another.

Of course, while four clock generator circuits 20a, 20b, 20c, 20d are implemented according to this example, it is contemplated that more or fewer such clock generator circuits may alternatively be used. Further in the alternative, one or more of clock generator circuits 20a through 20d may be constructed as a frequency divider receiving one of the outputs of one of the other clock generator circuits 20a through 20d, and generating its own output at some frequency that is divided down from that at its input.

In addition, an external time reference is applied to integrated circuit 10 according to these embodiments. This external time reference may be in the form of external crystal 13 connected at terminals of integrated circuit 10, to which system clock generator 21 is connected and generates a clock signal based on the resonant frequency of crystal 13, namely system clock sys_clk shown in FIG. 1a. System clock generator 21 may be constructed in the conventional manner, for example as an amplifier or logic gate in combination with the appropriate passive components to form a crystal oscillator circuit with crystal 13. Alternatively, integrated circuit 10 may receive, at its terminal CLK_IN, a system clock signal generated by an external system clock generator 15, in which case system clock sys_clk will correspond to that external clock. In either case, system clock sys_clk may be buffered, or divided (or multiplied) in frequency, from the external time reference. However produced, it is contemplated that system clock sys_clk will typically be as stable, over variations in operating conditions, as that external time reference. System clock sys_clk may be applied to input/output interface 17 as shown in FIG. 1a to synchronize input and output operations with external functions. System clock sys_clk may alternatively be provided to other functions in integrated circuit 10 if desired.

According to embodiments described below, system clock sys_clk is also applied to clock select logic 22 for use in selecting one of internal clock signals int_clka, int_clkb, int_clkc, int_clkd as internal clock int_clk. In the example of FIG. 1a, the selected internal clock int_clk is applied to FRAM 18 to control its operation; of course, internal clock int_clk may be applied to other functions within integrated circuit 10, such as those coupled to bus SBUS.

Figure 1B:
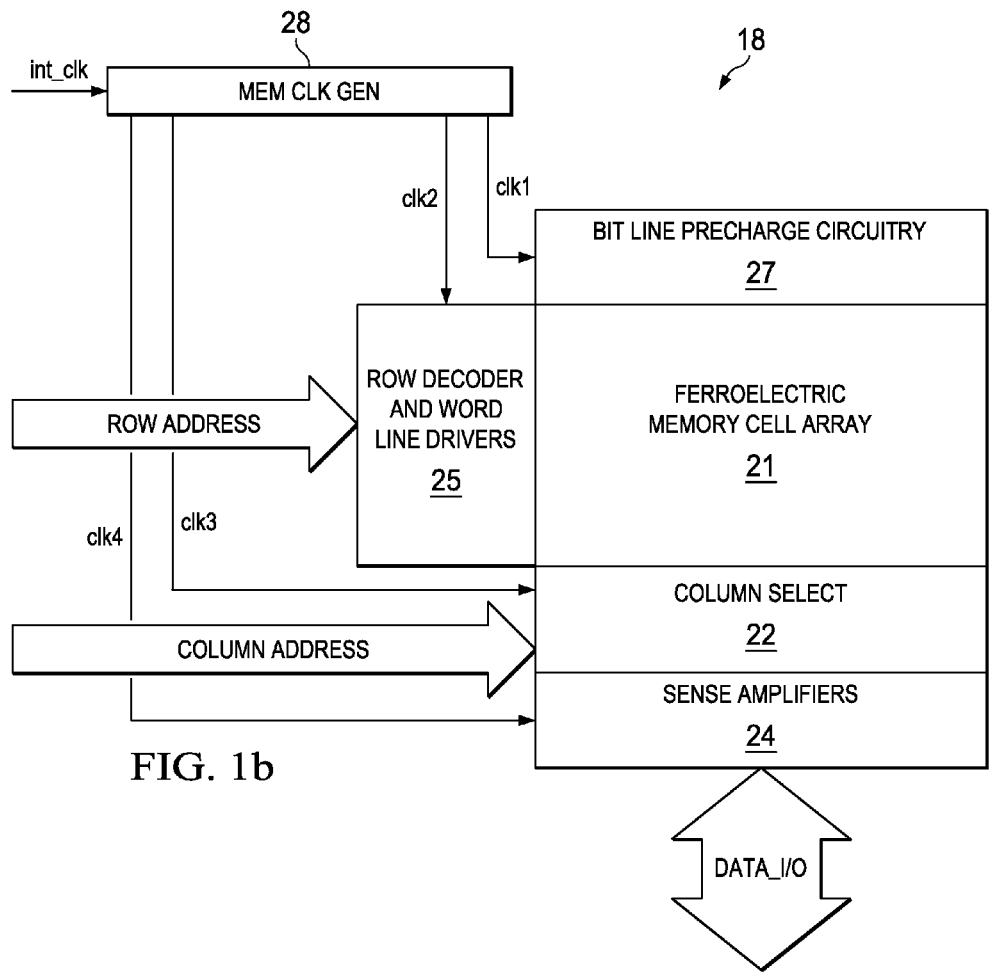

FIG. 1b illustrates the read path construction of FRAM 18 in integrated circuit 10, or alternatively, as mentioned above, in a stand-alone memory integrated circuit (i.e., rather than as embedded memory as shown in FIG. 1a). Those skilled in the art having reference to this specification will comprehend that the memory architecture of FRAM 18 in FIG. 1b is provided by way of example only. In this example, FRAM 18 includes a number of ferroelectric memory cells arranged in rows and columns within memory cell array 21. While a single instance of ferroelectric memory cell array 21 is shown in FIG. 1b, it is to be understood that FRAM 18 may include multiple ferroelectric memory cell arrays 21, each corresponding to a memory block within the address space of FRAM 18.

In the example shown in FIG. 1b, ferroelectric memory cell array 21 includes FRAM cells arranged in rows and columns, with cells in the same column sharing one or a pair of bit lines, and with cells in the same row sharing a word line. The FRAM cells in array 21 may be constructed in any one of a number of arrangements, including in any of the well-known 1T-1C, 2T-2C, and 6T-2C arrangements. Bit line precharge circuitry 27 is provided to apply a desired precharge voltage to the bit lines in advance of read operations. Row decoder and word line drivers 25 receive a row address value indicating the row in ferroelectric memory cell array 21 to be accessed, and in response energize the word line corresponding to that row address value. Column select circuit 22 receives a column address value, and in response selects corresponding bit lines that are to be placed in communication with sense amplifiers 24. Sense amplifiers 24 are constructed in the conventional manner, for example as a differential or single-ended amplifier coupled to the bit line or lines for each column selected by column select circuit 22. Sense amplifiers 24 generate a logic level signal in response to the level sensed at corresponding bit lines, and apply that signal in the usual manner to data bus DATA I/O.

Circuitry (not shown) for programming the states of cells in ferroelectric memory cell array 21 will also typically be provided, as will circuitry (also not shown) for selectively biasing the plates of the ferroelectric capacitors of the cells in array 21 as appropriate for the read and programming cycles. For purposes of this description of the context of embodiments of the invention, FIG. 1b illustrates the read path side of the architecture of FRAM 18, as the read cycle is typically more timing-critical than the programming operation.

In the example of FIG. 1b, the architecture of FRAM 18 also includes memory clock generator circuit 28, which may be realized as logic circuitry, including one or more counters. Memory clock generator circuit 28 receives internal clock int_clk from clock select logic 22 (FIG. 1a), and generates various clock phases clk1, clk2, clk3, clk4 etc. at the appropriate timing relative to one another to control the operation of circuitry in FRAM 18 in the read cycle. For purposes of this description, and as will become apparent from the following description, the period of internal clock int_clk is much shorter than the duration of a single read cycle of FRAM 18. In the example shown in FIG. 1b, clock phase clk1 energizes precharge circuitry 27, clock phase clk2 energizes row decoder and word line drivers 25, clock phase clk3 controls column decoder 22, and clock phase clk4 energizes sense amplifiers 24.

Since the various functional circuits in FRAM 18 are activated clock phases clk1, clk2, clk3, clk4 that are produced at certain cycle counts of internal clock int_clk in this embodiment, a successful read of cells addressed by the memory address received by FRAM 18 will require a certain number (m) of cycles of that internal clock int_clk. A shorter period of internal clock int_clk would thus enable faster memory access and cycle times. On the other hand, propagation delays in logic circuits, RC delays of the word line and bit lines, read current sourced by the ferroelectric memory cells, and the like necessitate specifying a minimum period t_int of internal clock int_clk to guarantee proper operation of FRAM 18 in the read operation. From a design standpoint, the minimum FRAM memory cycle time t_cyc of the product of this minimum internal clock period t_int and the number m of cycles of internal clock int_clk required for an FRAM access must be within the maximum memory cycle time defined by system specifications.

Figure 2:
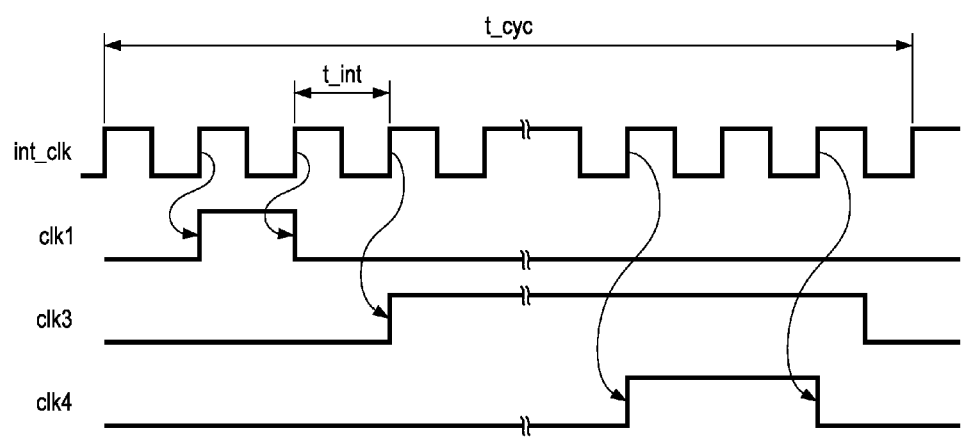
FIG. 2 is a timing diagram illustrating the timing of a memory read operation in the integrated circuit of FIG. 1.

The relative timing of some of the clock phases clk1 through clk4 generated by memory clock generator circuit 28 within the read cycle will now be described relative to FIG. 2. In the timing diagram of FIG. 2, internal clock int_clk is illustrated as a relatively high frequency periodic clock signal, with some number of internal clock int_clk occurring within a single FRAM read cycle time t_cyc as shown. FIG. 2 also illustrates an example of the timing at which memory clock generator circuit 28 generates clock phases clk1, clk3, clk4 on the elapse of selected numbers of cycles of internal clock int_clk. In this example, clock phase clk1 is driven active high in response to the leading edge of the second cycle of internal clock int_clk following the start of the memory cycle t_cyc, and driven inactive again by the leading edge of the third cycle of internal clock int_clk. Clock phase clk3 is driven active high by the leading edge of the fourth cycle of internal clock int_clk within the memory cycle t_cyc, and is driven low on the leading edge of the $n^{th}$ cycle of internal clock int_clk, (n cycles of internal clock int_clk occurring within memory cycle t_cyc in this example). Clock phase clk4 is driven active high for two cycles of internal clock int_clk near the end of the cycle as shown.

As discussed above in connection with the Background of the Invention, variations in fabrication process parameters, power supply voltage, and operating temperature cause significant variation in the performance and propagation delay of transistor circuits in modern integrated circuits. For the example of ring oscillators in which the oscillation frequency depends directly on propagation delays in the ring, these process, voltage, and temperature variations cause corresponding variations in the output frequency of the oscillator.

For circuits such as FRAM 18 in which a certain number of cycles of an internal clock at a minimum internal clock period is required for proper operation, the use of an internal oscillator to generate that internal clock over the applicable process, temperature, and voltage ranges for the integrated circuit can be problematic. This is especially the case in FRAM memories at low temperatures at which the read signal of the ferroelectric memory cell is both weaker and slower while the oscillation frequency of the CMOS oscillators is increased. According to embodiments of this invention, this difficulty is addressed by selecting the internal clock from among multiple clock generator circuits, depending on current operating conditions and the particular process parameters of the integrated circuit, with that selection based on an external time reference as will now be described in detail.

Figure 3:
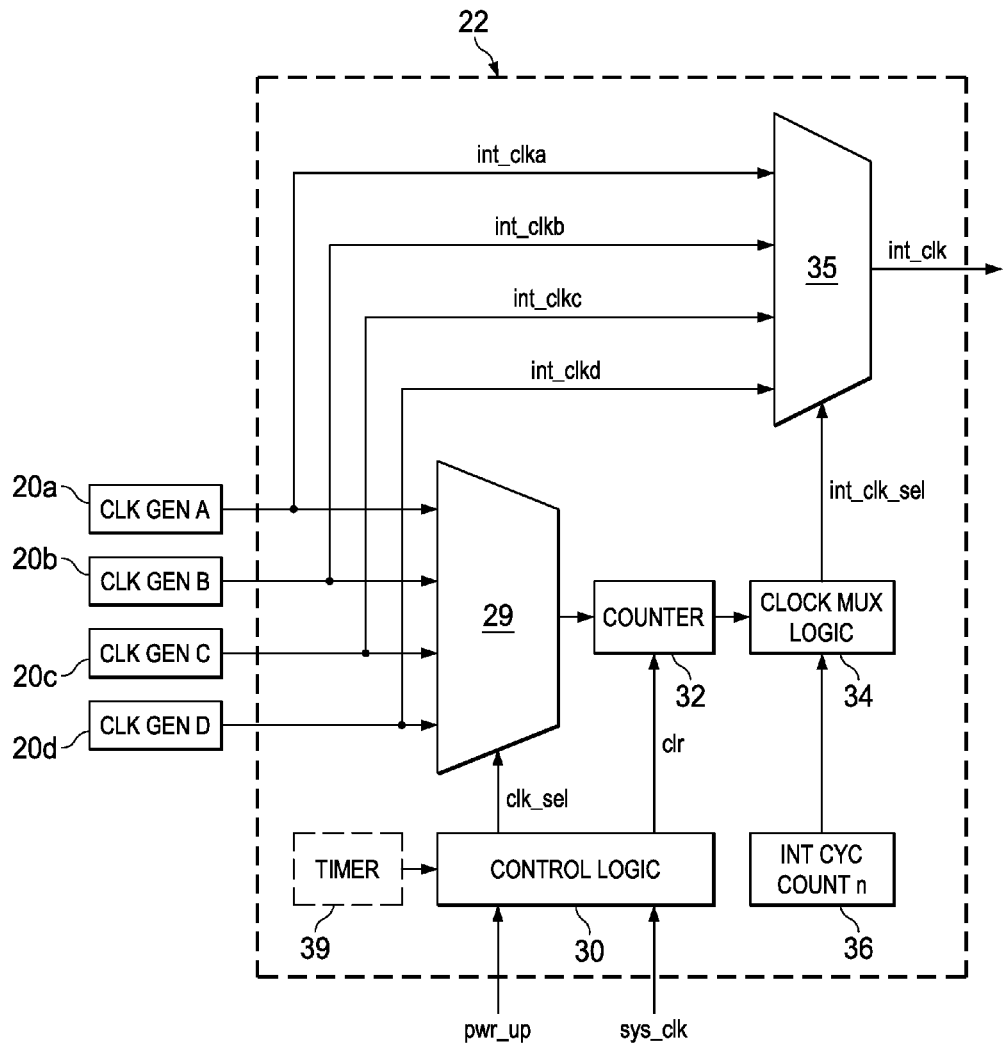
FIG. 3 is an electrical diagram, in block form, of clock select logic in the integrated circuit of FIG. 1 according to an embodiment.

FIG. 3 illustrates the construction of clock select logic 22 of integrated circuit 10, which selects the output of one of clock generator circuits 20a, 20b, 20c, 20d for use as internal clock int_clk in such a manner that the requirements of various functions within integrated circuit 10 can reliably operate over a wide range of process parameters, and voltage and temperature conditions. For the particular case of FRAM 18 in integrated circuit 10, these embodiments enable the reliable selection of internal clock int_clk so as to provide the necessary number of internal clock cycles of at least the minimum necessary internal clock period t_int within the specified maximum memory cycle time t_cyc, over a wide range of process parameters and operating conditions.

In the example of FIG. 3, clock generator circuits 20a through 20d communicate their internal clock signals int_clka through int_clkd, respectively, to corresponding inputs of multiplexer 29. Multiplexer 29 is controlled by control signal clk_sel issued by control logic 30. Control logic 30 receives signal pwr_up and system clock sys_clk at inputs; optionally, clock select logic 22 also includes timer 39 that also issues a signal to control logic 30. As will be described below, control logic 30 operates in response to those inputs to select one of internal clock signals int_clka through int_clkd to be applied to an input of counter 32. Counter 32 is a conventional counter that counts cycles of the clock signal applied at its input, and has an input receiving clear signal clr from control logic 30. The output of counter 32 is applied to an input of clock multiplexer logic 34, which also receives the contents of register 36 at an input. Clock multiplexer logic 34 issues a select signal int_clk_sel that is applied to the control input of multiplexer 35, which also receives internal clock signals int_clka through int_clkd at its inputs. Multiplexer 35 presents internal clock int_clk corresponding to the one of internal clock signals int_clka through int_clkd indicated by select signal int_clk_sel from clock multiplexer logic 34.

The operation of clock select logic 22, according to an embodiment, will now be described with reference to the flow diagram of FIG. 4a, beginning with the power up of integrated circuit 10 in process 40. According to this embodiment, the power up of integrated circuit 10 in process 40 causes control circuitry in integrated circuit 10 (e.g., power circuitry 14 shown in FIG. 1a) to issue signal pwr_up to control logic 30. Also as integrated circuit 10 powers up in process 40, clock generator circuits 20a through 20d begin operation, outputting internal clock signals int_clka through int_clkd at their respective frequencies, given the relevant process parameters of that instance of integrated circuit 10 and its current operating conditions (power supply voltage $V_{dd}$, operating temperature, etc.).

As clock generator circuits 20a through 20d begin operation, and in response to receiving signal pwr_up at its control logic 30, clock select logic 22 executes process 44 to count the number of cycles of each of internal clock signals int_clka through int_clkd relative to a cycle of system clock sys_clk, in process 44. In this embodiment, control logic 30 carries out process 44 by successively selecting internal clock signals internal clock signals from clock generator circuits 20a through 20d, respectively, for application to counter 32. More specifically in this process 44, control logic 30 issues signal clk_sel to multiplexer 29 to select one of internal clock signals int_clka through int_clkd (e.g., internal clock signal int_clka) for application to the input of counter 32. At the beginning of a period of system clock sys_clk (e.g., responsive to its rising edge), control logic 30 clears counter 32 by way of signal clr, following which counter 32 counts the number of periods of selected internal clock signal int_clka, for example by counting rising edges of that signal. Upon the beginning of the next period of system clock sys_clk, the contents of counter 32 are forwarded to clock multiplexer logic 34; counter 32 has thus counted the number of cycles of the selected internal clock signal occurring within a cycle of system clock sys_clk. At this time, control logic 30 selects another one of the internal clock signals int_clka through int_clkd for application to counter 32 via multiplexer 29, and clears counter 32. The number of cycles of that internal clock signal occurring within a period of system clock sys_clk is then counted by counter 32 and forwarded to clock multiplexer logic 34. This operation repeats until the internal clock signals issued by clock generator circuits 20a through 20d have all been counted relative to system clock sys_clk.

Alternatively to this sequential counting of cycles of the internal clock signals, it is contemplated that clock select logic 22 may implement multiple counters operating in parallel, one for each of clock generator circuits 20a through 20d. Other architectures for clock select logic 22 are also contemplated.

In any case, according to this embodiment, counts of cycles of internal clock signals int_clka through int_clkd within one system clock period t_sys_clk are determined in process 44. As discussed above, the frequencies at which clock generator circuits 20a through 20d operate, and thus these cycle counts, vary with the particular process parameters (e.g., transistor gate width, threshold voltage, etc.) in this instance of integrated circuit 10 and on its current operating conditions (power supply voltage, temperature).

Figure 5A:
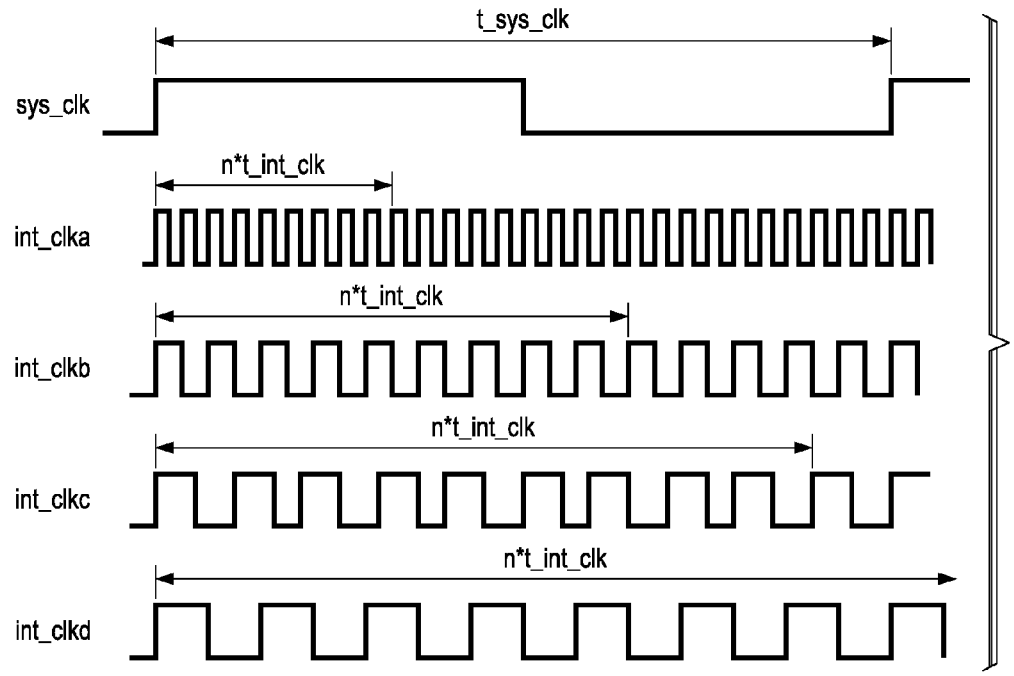
FIGS. 5a and 5b are timing diagrams illustrating the operation of clock generator circuits under different conditions of process variations, power supply voltage, and temperature.
Figure 5B:
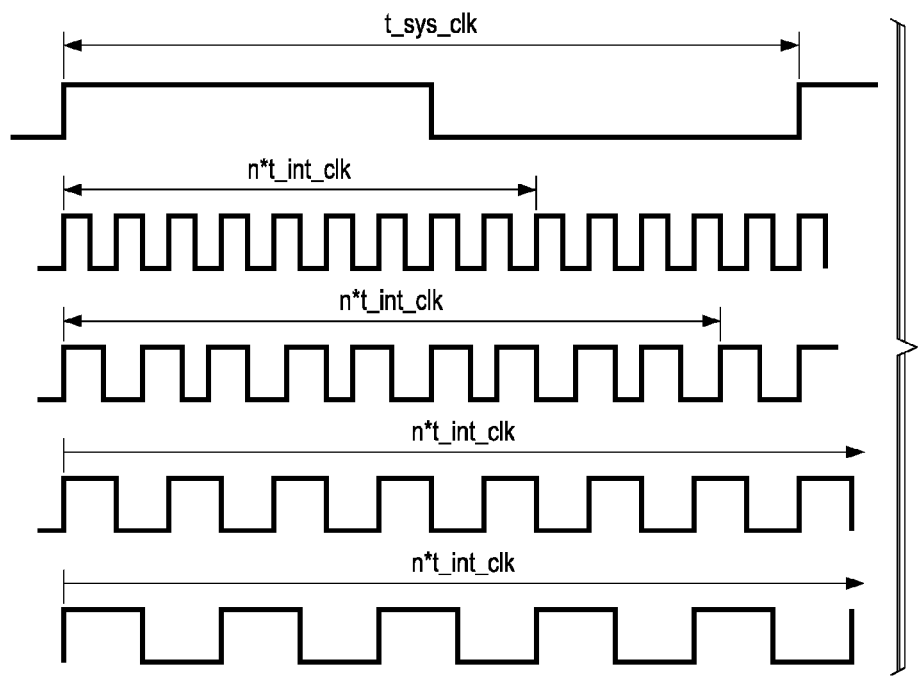

FIGS. 5a and 5b illustrate examples of the variation in frequency of internal clock signals, such as internal clock signals int_clka through int_clkd, relative to a stable clock signal such as system clock sys_clk. In each of FIGS. 5a and 5b, externally-referenced system clock sys_clk is shown as a reference and can be assumed to have a stable period t_sys_clk, as is typical in the art. A comparison of the period of each of internal clock signals int_clka, int_clkb, int_clkc, int_clkd between that shown in FIG. 5a versus that shown in FIG. 5b provides a qualitative indication of the extent of variation observed in modern integrated circuits; as noted above, as large as 100% variation in output frequency has been observed for a given oscillator over expected variations in process parameters and operating conditions.

More specifically, the example of FIG. 5a corresponds to a relatively fast "corner" of process parameters (e.g., narrow gate widths, low threshold voltage) and operating conditions (e.g., high power supply voltage, low temperature), at which the frequencies of internal clock signals int_clka, int_clkb, int_clkd are relatively high. At this fast corner in this example, within a cycle of system clock sys_clk, twenty-eight cycles of internal clock signal int_clka occur, fourteen cycles of internal clock signal int_clkb occur, ten cycles of internal clock signal int_clkc occur, and seven cycles of internal clock signal int_clkd occur. Conversely, the example of FIG. 5b corresponds to a relatively slow corner of process parameters (e.g., wide gate widths, high threshold voltage) and operating conditions (e.g., low power supply voltage, high temperature), at which the frequencies of internal clock signals int_clka, int_clkb, int_clkd are lower. At this slow corner in this example, fourteen cycles of internal clock signal int_clka, ten cycles of internal clock signal int_clkb, seven cycles of internal clock signal int_clkc, and four full cycles of internal clock signal int_clkd occur within one system clock period t_sys_clk. Depending on the particular process parameters and current operating conditions of integrated circuit 10, cycle counts such as these for each of internal clock signals int_clka, int_clkb, int_clkd are obtained by counter 32 and forwarded to clock multiplexer logic 34 in process 44.

Upon completion of process 44 for all of clock generator circuits 20a through 20d in integrated circuit 10, clock multiplexer logic 34 then executes processes 46, 48 to determine which of internal clock signals int_clka through int_clkd is to serve as internal clock int_clk. As discussed above, a number m of cycles of internal clock int_clk are necessary in order to perform a particular function within integrated circuit 10 within a single system clock period t_sys_clk. For the example of a read cycle of FRAM 18 discussed above, these m cycles of internal clock int_clk must occur within a specified maximum memory cycle time t_cyc. The constraint of maximum memory cycle time t_cyc for FRAM 18 then requires:

$$m \cdot t\_int\_clk < t\_cyc$$

t_int_clk being the period of internal clock int_clk. As discussed above, in process 44, counter 32 under the control of control logic 22 counts the number n of cycles of each of internal clock signals int_clka through int_clkd within one system clock period t_sys_clk. For a given one of those internal clock signals int_clka through int_clkd, having a period p, the number n of cycles counted in process 44 is:

$$\frac{1}{f_{sys} \cdot p} = n$$

where $f_{sys}$ is the frequency of system clock sys_clk. Minimum cycle count n, which is the minimum number of cycles of internal clock signals int_clka through int_clkd within one system clock period t_sys_clk that satisfies the maximum memory cycle time constraint t_cyc, can thus be expressed as:

$$n \geq \frac{m}{f_{sys} \cdot t\_cyc}$$

Typically, this number n is identified in the design process of integrated circuit 10 and, in this embodiment, is stored in register location 36 as shown in FIG. 3.

Alternatively, instead of the memory cycle time constraint t_cyc, the maximum read access time may be used to define the minimum cycle count n. It is contemplated that those skilled in the art having reference to this specification can readily derive the appropriate relationship based on read access time.

In process 46 according to this embodiment, clock multiplexer logic 34 compares the cycle counts obtained for each of internal clock signals int_clka through int_clkd with that number n, to identify those of internal clock signals int_clka through int_clkd that have cycle counts equal to or greater than the identified number n of internal clock int_clk cycles. Any one of those identified internal clock signals int_clka through int_clkd can theoretically serve as internal clock int_clk, by providing a sufficient number of internal clock cycles to accomplish the function within the maximum memory cycle time t_cyc.

For example, FIGS. 5a and 5b illustrate which of internal clock signals int_clka through int_clkd produce n cycles within a single cycle of system clock sys_clk, for the case of n=9. At the fast corner of FIG. 5a, each of internal clock signals int_clka, int_clkb, and int_clkc are at a sufficiently high frequency to produce nine or more cycles (as shown by the measure n*t_int_clk) within one system clock period t_sys_clk. Internal clock signal int_clkd has only seven cycles within a cycle of system clock sys_clk, and as such is not one of the internal clock signals identified in process 46 under these conditions. At the slow corner shown by FIG. 5b, only internal clock signals int_clka and int_clkb are at a sufficiently high frequency to produce nine or more cycles within one system clock period t_sys_clk; internal clock signals int_clkc and int_clkd have fewer than nine cycles within that one period.

As is also mentioned above, however, the period of internal clock int_clk must be at least as long as some minimum period t_int to ensure proper operation. Indeed, it may often be desirable for the period of internal clock int_clk to be as long as possible, so long as the maximum memory cycle time t_cyc is met. Stated another way, with reference to the "fast" conditions (process, voltage, and temperature) corresponding to FIG. 5a, the n=9 cycles of internal clock int_clka consume only slightly more than one-quarter of system clock period t_sys_clk, as the cycle count of internal clock signal int_clka obtained in process 44 is twenty-eight. On the other hand, the n=9 cycles of internal clock int_clkc consume nearly the entirety of system clock period t_sys_clk, as the cycle count of internal clock signal int_clkc obtained in process 44 is ten. Accordingly, the period of internal clock signal int_clkc is much longer than that of internal clock signal int_clka, which allows for more robust operation of the internal functions of integrated circuit 10 while still attaining the necessary number n cycles within the maximum memory cycle time t_cyc. The selection of internal clock signal int_clkc from clock generator circuit 20c is therefore the optimal selection, under the example of the conditions shown in FIG. 5a.

Accordingly, in process 48, clock multiplexer logic 34 selects, for use as internal clock int_clk, the one of internal clock signals int_clka through int_clkd that provides at least as many as n cycles within one system clock period t_sys_clk, but has the lowest count of cycles among those internal clock signals int_clka through int_clkd identified in process 46 as having at least n cycles within that period t_sys_clk. More generally, the one of internal clock generator circuits 20a through 20d operating at the lowest frequency that produces at least n cycles within a cycle of system clock signal sys_clk is selected for use as internal clock int_clk. As mentioned above, at the fast corner shown in FIG. 5a, internal clock signal int_clkc from clock generator circuit 20c will be selected as internal clock int_clk in process 48, as it has the fewest number of cycles within system clock period t_sys_clk equal to or greater than the number n. Similarly, at the slow corner shown in FIG. 5b, internal clock signal int_clkb from clock generator circuit 20b will be selected in process 48, as it has the fewest number of cycles within system clock period t_sys_clk (i.e., ten) equal to or greater than the number n=9. As a result of this determination in process 48, clock multiplexer logic 34 issues the appropriate value of signal int_clk_sel to multiplexer 35 to cause selection of the corresponding one of internal clock signals int_clka through int_clkd for use as internal clock int_clk. Operation of integrated circuit 10 using the selected internal clock signal from one of the plurality of clock generator circuits 20a through 20d can then commence.

This description of the operation of clock select logic 22 refers to the initiation of the clock selection process on power-up of integrated circuit 10. It is contemplated, however, that this process is not limited to use only on power-up. More specifically, it is contemplated that the operating conditions of integrated circuit 10 may change over time, most likely from changes in the operating temperature, although variations in the applied power supply voltage may also occur. According to another embodiment, as shown in FIG. 3, optional timer 39 is provided within clock select logic 22 to detect the elapse of a selected operating time (for example, as may be programmed in a configuration register) and to issue a signal to control logic 22 in that event. It is contemplated that this selected time will typically be design-specific, and may also depend on how rapidly the device environment may change in the intended application.

Figure 4A:
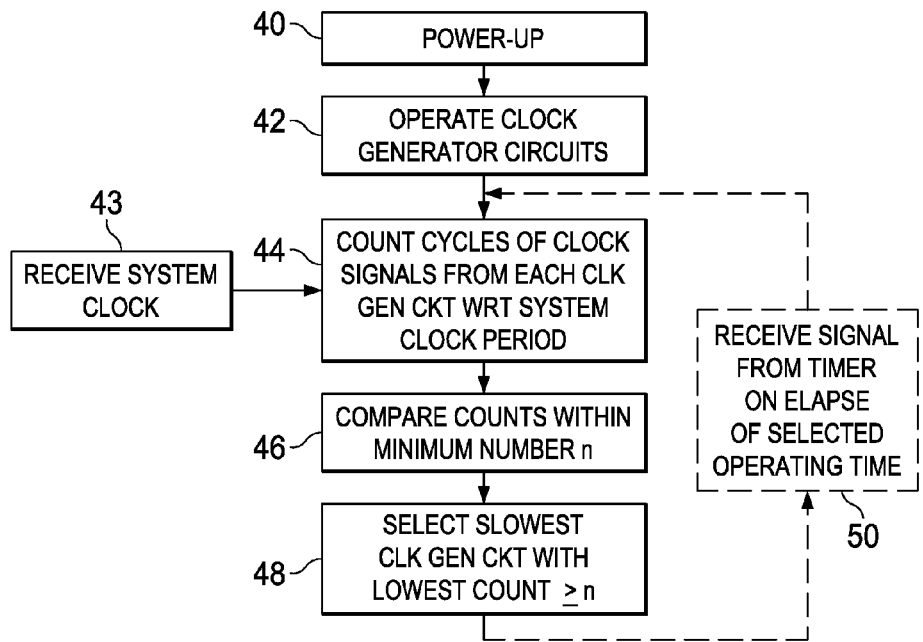
FIGS. 4a and 4b are flow diagrams illustrating the operation of the integrated circuit of FIG. 1 according to embodiments.

Upon receipt of that indication that a certain operating time has elapsed, as shown by optional process 50 in FIG. 4a, control logic 22 can then initiate process 44 to count cycles of internal clock signals int_clka through int_clkd within a system clock period t_sys_clk, to determine via processes 46, 48 whether conditions have changed sufficiently to cause selection of a different one of those internal clock signals int_clka through int_clkd as internal clock int_clk. Operation of integrated circuit 10 continues, based on internal clock int_clk as newly selected in process 48. Timer 39 may then again begin a new measurement of elapsed operating time, and the process continues. For the case of a memory integrated circuit, it is contemplated that this repeated selection of one of those internal clock signals int_clka through int_clkd may be performed in parallel with a memory access time, so that no memory dead time is incurred beyond that required in the initial selection.

Figure 4B:
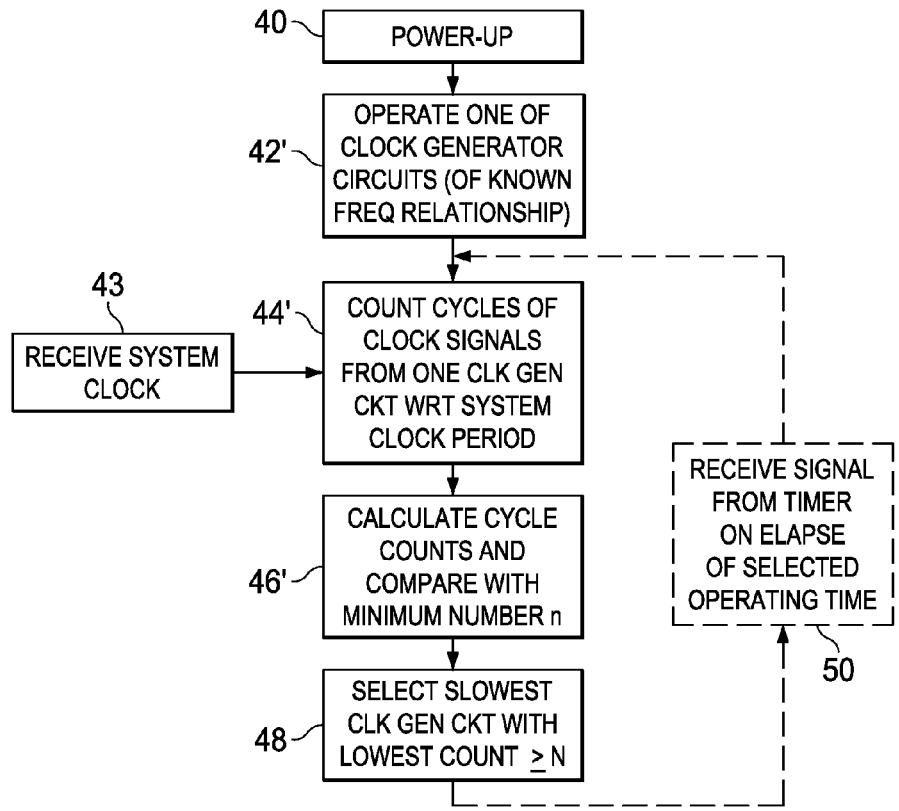

According to another embodiment, shown in FIG. 4b, the frequency relationship among clock generator circuits 20a through 20d may be known; for example, clock generator circuit 20b may run at half the frequency of clock generator circuit 20a, clock generator circuit 20c may run at half the frequency of clock generator circuit 20b, and so on. If the frequency relationships among the clock generator circuits 20a through 20d are known, the determination of which of internal clock signals int_clka through int_clkd may be determined from analyzing only one of those signals.

According to this embodiment, a selected one of clock generator circuits 20a through 20d is operated in process 42'. The number of cycles of the corresponding one of internal clock signals int_clka through int_clkd within one system clock period t_sys_clk is then counted in process 44'. Alternatively, all of clock generator circuits 20a through 20d may be operated in process 42' but only one need be coupled or applied to counter 32 in process 44'. Further in the alternative, it is contemplated that multiple frequency relationships may exist among the clock generator circuits 20a through 20d, in which case one clock generator circuit from each subset of related circuits would be operated and counted.

In any case, in process 46', the known frequency relationship among clock generator circuits 20a through 20d is then used to calculate the corresponding number of cycles of the remainder of internal clock signals int_clka through int_clkd from those clock generator circuits 20a through 20d that were not operated in process 42'. It is contemplated that clock multiplexer logic 34 may carry out this calculation of process 46'; alternatively, other circuitry such as microprocessor unit 12 may perform that calculation. Following the determination of these cycle counts, whether by measurement or calculation, process 48 is then performed as previously described to select, for use as internal clock int_clk, the one of internal clock signals int_clka through int_clkd with the lowest cycle count that provides at least as many as n cycles within one system clock period t_sys_clk. More generally, the one of internal clock generator circuits 20a through 20d that will operate at the lowest frequency capable of producing at least n cycles within a cycle of system clock signal sys_clk is selected for use as internal clock int_clk. Clock multiplexer logic 34 then controls multiplexer 35 to select that corresponding one of internal clock signals int_clka through int_clkd for use as internal clock int_clk.

This alternative embodiment thus provides a lower power approach to the selection of the appropriate internal clock signal. In addition, the construction of clock select logic 22 for carrying out this selection may be simplified according to this alternative embodiment, in that only one of the outputs of clock generator circuits 20a through 20d need be coupled to counter 32, avoiding the need of multiplexer 29 and the corresponding portion of control logic 22.

Each of the embodiments described above provide important advantages in the design and operation of complex integrated circuits. As a result of these embodiments, internal oscillator circuits and other internal clock generator circuits may be used to generate internal clock signals in the integrated circuit while ensuring robust operation of circuit functions over wide ranges of operating conditions and process variables. In particular, those integrated circuits such as FRAM memories having characteristics that vary with operating conditions in the opposite direction from that of other devices, such as CMOS transistors and switching circuits, can be accommodated, without requiring over-design margin that can adversely affect the overall performance of the integrated circuit. In addition, it is contemplated that these embodiments of the invention can be readily implemented in integrated circuit designs, with relatively little additional chip area required.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of generating an internal clock signal in an integrated circuit, comprising:
   operating at least one of a plurality of clock generator circuits in the integrated circuit, each of the plurality of clock generator circuits generating a clock signal at a frequency differing from that others of the plurality of clock generator circuits;
   counting a number of clock cycles from at least one of the plurality of clock generator circuits relative to a system clock signal corresponding to an external time reference;
   then selecting the internal clock signal as the output of the one of the plurality of clock generator circuits generating its clock signal at the lowest frequency, among the plurality of clock generator circuits, capable of producing at least a selected number of cycles within a cycle of the system clock signal.

2. The method of claim 1, wherein the operating step operates each of the plurality of clock generator circuits;
   wherein the counting step counts a number of clock cycles from each of the plurality of clock generator circuits;
   and wherein the selecting step comprises:
      selecting the one of the plurality of clock generator circuits corresponding to its counted number of clock cycles being the smallest number of the measured numbers of clock cycles exceeding the selected number of cycles.

3. The method of claim 1, wherein the frequencies of the clock signals from the plurality of clock generator circuits have a known relationship relative to one another;
   wherein the operating step operates a subset of the plurality of clock generator circuits;
   wherein the counting step counts a number of clock cycles from the subset of the plurality of clock generator circuits;
   and wherein the selecting step comprises:
      selecting one of the plurality of clock generator circuits responsive to the counted number of clock cycles from the subset of the plurality of clock generator circuits.

4. The method of claim 3, wherein the subset of the plurality of clock generator circuits is a single one of the plurality of clock generator circuits.

5. The method of claim 1, wherein the operating, measuring, and selecting steps are performed on power-up of the integrated circuit.

6. The method of claim 5, further comprising:
   then periodically repeating the operating, measuring, and selecting steps.

7. The method of claim 1, further comprising:
   periodically repeating the operating, measuring, and selecting steps.

8. The method of claim 1, wherein the selected number of cycles corresponds to a minimum number of internal clock cycles required for a memory access within a maximum time constraint.

9. An integrated circuit, comprising:
   an input receiving an external time reference;
   a plurality of clock generator circuits, each of the plurality of clock generator circuits generating a clock signal at a frequency differing from that of others of the plurality of clock generator circuits;
   logic circuitry for performing a plurality of operations comprising:
      operating at least one of a plurality of clock generator circuits;
      counting a number of clock cycles from at least one of the plurality of clock generator circuits relative to a system clock signal corresponding to the external time reference;
      responsive to the measured number of clock cycles, selecting the internal clock signal as the output of the one of the plurality of clock generator circuits generating its clock signal at the lowest frequency, among the plurality of clock generator circuits, capable of producing at least a selected number of cycles within a cycle of the system clock signal.

10. The integrated circuit of claim 9, wherein the external time reference is a crystal oscillator coupled to the input;
    and further comprising:
       a system clock generator circuit coupled to the input, and generating the system clock signal based on the crystal oscillator.

11. The integrated circuit of claim 9, wherein the external time reference is a system clock signal applied to the input.

12. The integrated circuit of claim 9, further comprising:
    a memory array comprising a plurality of ferroelectric memory cells;
    read circuitry for reading a stored state of a selected one or more of the memory cells.

13. The integrated circuit of claim 12, wherein the selected number of cycles corresponds to a minimum number of internal clock cycles required to read the stored state of the selected memory cells within a maximum time constraint.

14. The integrated circuit of claim 9, wherein the logic circuitry operates each of the plurality of clock generator circuits and counts a number of clock cycles from each of the plurality of clock generator circuits;
    and wherein the one of the plurality of clock generator circuits is selected corresponding to its counted number of clock cycles being the smallest number of the measured numbers of clock cycles exceeding the selected number of cycles.

15. The integrated circuit of claim 9, wherein the frequencies of the clock signals from the plurality of clock generator circuits have a known relationship relative to one another;

wherein the logic circuitry operates a subset of the plurality of clock generator circuits and counts a number of clock cycles from the subset of the plurality of clock generator circuits;

and wherein the one of the plurality of clock generator circuits is selected responsive to the counted number of clock cycles from the subset of the plurality of clock generator circuits.

16. The integrated circuit of claim 15, wherein the subset of the plurality of clock generator circuits is a single one of the plurality of clock generator circuits.

17. The integrated circuit of claim 9, wherein the logic circuitry performs the operating, measuring, and selecting on power-up of the integrated circuit.

18. The integrated circuit of claim 17, wherein the logic circuitry then periodically repeats the operating, measuring, and selecting.

19. The integrated circuit of claim 9, wherein the logic circuitry then periodically repeats the operating, measuring, and selecting.

* * * * *